United States Patent [19]

Shepherd

[11] Patent Number: 5,140,196
[45] Date of Patent: Aug. 18, 1992

[54] VARIABLE LEVEL TRANSLATOR

[75] Inventor: Wayne P. Shepherd, Ft. Lauderdale, Fla.

[73] Assignee: Motorola, Inc., Schaumburg, Ill.

[21] Appl. No.: 684,754

[22] Filed: Apr. 15, 1991

[51] Int. Cl.⁵ .................................. H03K 19/003
[52] U.S. Cl. .................................. 307/475; 307/362; 307/443
[58] Field of Search ............... 307/443, 455, 355, 356, 307/475, 446, 570, 542, 544, 558, 262, 362; 375/76

[56] References Cited

U.S. PATENT DOCUMENTS

| | | | |
|---|---|---|---|
| 4,516,247 | 5/1985 | Carsalade et al. | 307/356 X |
| 4,994,691 | 2/1991 | Naghshineh | 307/475 |
| 5,023,478 | 6/1991 | Boudon et al. | 307/475 X |
| 5,039,881 | 8/1991 | Ooms et al. | 307/475 X |
| 5,045,729 | 9/1991 | Yee et al. | 307/475 |
| 5,045,801 | 9/1991 | Mowery | 307/475 X |

*Primary Examiner*—David Hudspeth
*Attorney, Agent, or Firm*—Pedro P. Hernandez

[57] ABSTRACT

A voltage level shifting circuit (100) comprises an input port (160) and output terminal (162). The voltage level shifting circuit (100) further comprises a voltage translation circuit which generates first and second voltage levels, both of which are related to the input reference voltage and which both vary with variations in the input voltage. A control circuit (158) controls which of the two voltage levels produced by the voltage translation circuit is presented at output terminal (162), depending on the voltage level at the control circuit input port (168).

11 Claims, 2 Drawing Sheets

VARIABLE LEVEL TRANSLATOR

TECHNICAL FIELD

This invention relates to voltage level shifting circuits, and more specifically to a variable level voltage shifting circuit.

BACKGROUND

Voltage level shifting circuits are well known in the art. Level shifting circuits are used when interfacing different types of circuits to each other, such as when interfacing circuits operating at one particular voltage to circuits operating at another voltage level, for example when interfacing emitter coupled logic operating at a few millivolts (ECL) to complimentary metal-oxide semiconductor (CMOS) circuits operating at several volts of potential. Present level shifting circuits normally just shift a fixed input voltage to an output voltage which is either greater or smaller than the input voltage. These present level shifting circuits do not allow for the operation of a low voltage breakdown device such as a small geometry field-effect transistor (FET) which has an active bias level to operate in a high voltage circuit and avoid the device from exceeding its breakdown voltage.

SUMMARY OF THE INVENTION

Briefly, according to the invention, a voltage level shifting circuit comprises an input port for receiving an input reference voltage which can vary within a predetermined voltage range. A voltage translation means generates first and second voltage levels, both of which are related to the input reference voltage and vary with variations in the input reference voltage. The voltage level shifting circuit further comprises control means for operatively selecting either the first or second voltage levels produced by the voltage translation means, in response to the voltage level present at the control means input port. The control means produces an appropriate control signal at the control means output port which causes the selected voltage level to be presented at an output terminal.

In another aspect of the present invention a communication device having a voltage level shifting circuit is disclosed.

DETAILED DESCRIPTION OF THE PREFERRED EMBODIMENT

Figure 1:
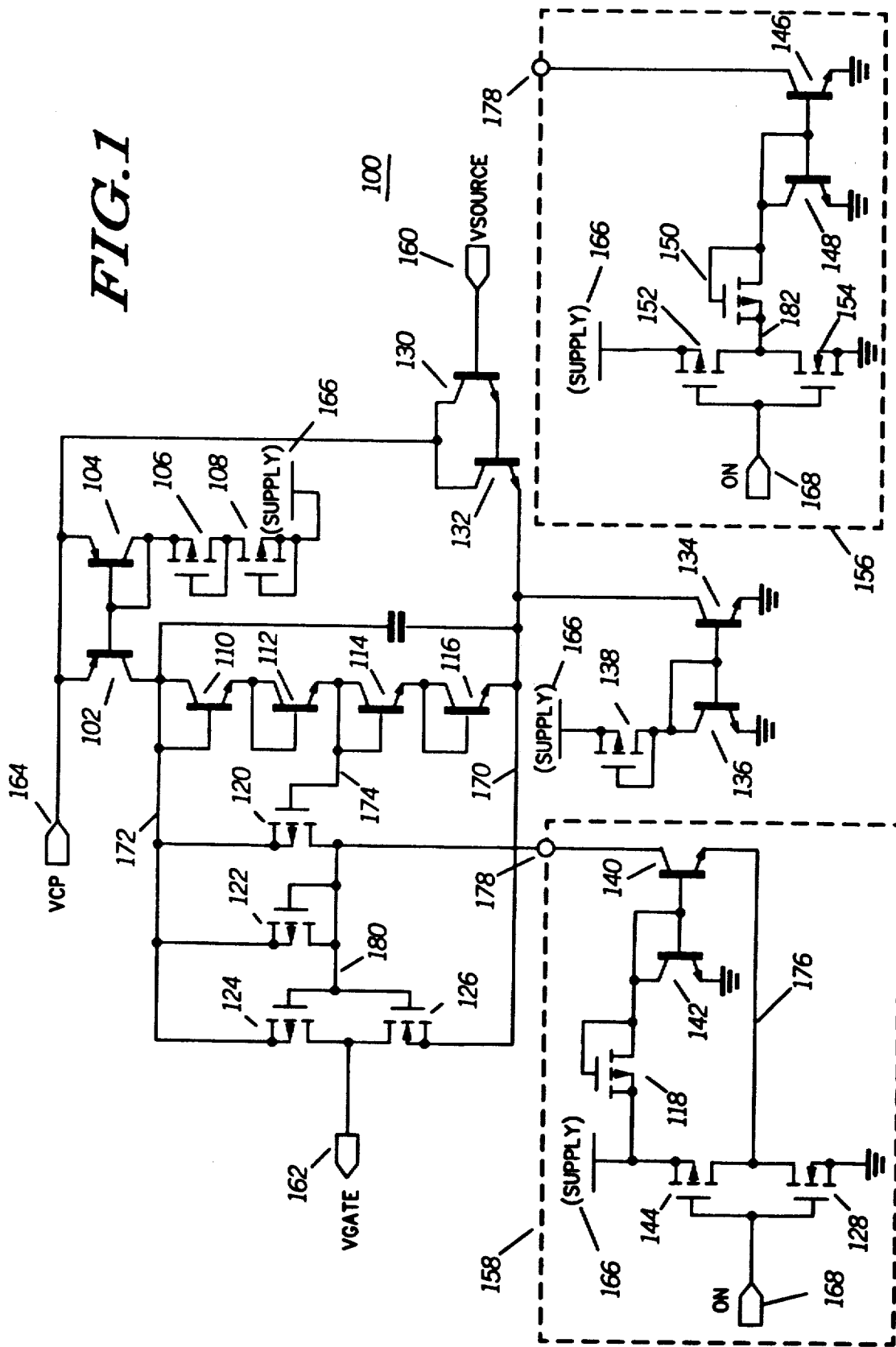
FIG. 1 is a voltage level shifting circuit in accordance with the present invention.

FIG. 1 shows a schematic of a voltage level shifting circuit such as a variable level translator circuit 100 in accordance with the present invention. Variable level translator 100 comprises an input port 160 which is preferably connected to the source terminal of the field effect transistor (FET) or external circuit which requires sensing. In the preferred embodiment, the voltage at input port 160 can vary between two and eleven volts as the bias to the FET, that is connected to input, 160 varies. Input port 160 is directly connected to the base of NPN transistor 130 which, in turn, has its emitter terminal connected to the base of NPN transistor 132. Transistor pair 130 and 132 form a voltage drop stage which receives the input reference voltage from input 160 and has an output at the emitter terminal of transistor 132 for providing an output which is a predetermined amount lower than the input reference voltage. The voltage drop stage is coupled to a lower voltage rail 170, and produces the voltage level at the lower voltage rail by dropping the voltage at input port 160 (V source) by approximately two $V_{BE}$ ($\approx 1.4$ Volts). The collectors of transistors 130 and 132 are connected together and coupled to a first operating voltage (VCP) 164 which is preferably set at approximately 13.8 volts. Although the preferred embodiment shows the voltage drop stage dropping the input voltage by 2 $V_{BE}$, any other voltage drop could be designed for.

Transistors 138, 136, and 134 form a constant current sink stage. A second operating voltage or supply voltage 166 in this particular embodiment, is set at five volts and is connected to the source pin of FET 138 which is configured as a resistor which is in turn coupled to the base of third transistor 136 and fourth transistor 134. The collector of NPN transistor 134 is connected to lower voltage rail 170 in order to sink current from the lower voltage rail.

FET transistors 110, 112, 114, and 116 which form the voltage rail stage are configured as four series connected diodes connected between lower voltage rail 170 and top voltage rail 172. One skilled in the art can realize that the preferred embodiment was designed using FETs since voltage level shifting circuit 100 was designed for implementation in an integrated circuit (IC). If translator circuit 100 were to be built with discrete components, standard diodes and transistors could have been used just as readily. Top voltage rail 172 has a voltage of V source $+2\ V_{BE}$ ($\approx V$source $+1.4$ volts) since it is 4 $V_{BE}$ greater than the $-2\ V_{BE}$ of lower voltage rail 170. Therefore, top voltage rail 172 is $+2\ V_{BE}$ above the voltage potential at input port 160 and lower voltage rail 170 is $-2V_{BE}$ below the voltage potential at input 160. For example, if the voltage at input 160 is 4.7 volts, the lower voltage rail 170 will be at approximately 3.3 volts, while the top voltage rail 172 will be at approximately 6.1 volts. Although only four transistors (110, 112, 114, and 116) are employed in the preferred embodiment, any other quantity of transistors between the top 172 and lower 170 voltage rails, can be designed.

FET transistors 102, 104, 106, and 108 are configured to form a constant current source stage, such as a well known standard constant current source circuit, connected to top voltage rail 172. The constant current circuit along with the constant sink circuit helps maintain a constant $V_{BE}$ drop across each of the diode junctions formed by diodes (FETs configured as diodes) 110, 112, 114, and 116, thereby maintaining a constant $\Delta V$ between top voltage rail 172 and lower voltage rail 170, irrespective of how the voltage varies at input port 160. The emitter of first transistor 102 and second transistor 104 are connected to a first operating voltage 164, while the bases of both transistors are coupled, via transistors 106 and 108, to a second operating voltage (supply) 166 which is set at approximately 5 volts. By maintaining an approximately constant voltage difference at voltage rails 172 and 170, any variations in input voltage are tracked by the two voltage levels (top and lower voltage rail voltages) produced by the voltage translation means (VTM). The VTM consists of all of the components between input port 160 and output terminal 162 but not including control circuit 158 or 156 (i.e., voltage drop stage, voltage rail stage, constant current stage, constant sink stage, control stage, etc.).

FETs 124, 126, form an inverter stage such as a conventional inverter circuit. The gate terminals of FETs 124 and 126 are connected to input 180 which is in turn, connected to output port 178 of control circuit 158. A logic high (for example +5 volts) at inverter input 180 will produce a low (e.g., zero volts) at output terminal 162, and vice versa. Connected between top rail 172 and the gate of FET 124 and 126 is first FET 122, which is configured as a conventional pull-up resistor. Second FET 120 is connected at its source terminal to top rail 172, at its gate terminal to the middle of the voltage rail 174, and at its drain terminal to control terminal 178. Transistors 120, 122, 124, and 126 form a control stage having an input port 180 and an output port which is the junction of the drain terminals of transistors 124 and 126. Finally, an output terminal 162 is provided in order to present either the first voltage level which is the voltage of the top voltage rail 172 ($V_{source} + 2V_{BE}$), or the second voltage level which is the voltage of the lower voltage rail 170 ($V_{source} - 2V_{BE}$).

In the preferred embodiment, a control means such as a control logic circuit 158 is used to control the "on" and "off"switching of an N-channel type FET connected at pins 162 and 160, with the gate terminal of the FET in question connected at pin 162, and the source terminal at pin 160. In the case of P-channel FET control logic circuit 156 is used to control translation circuit 100 instead of control logic circuit 158. In circuit 158, transistors 142 and 140 are configured as a current mirror which pulls down the voltage at control terminal 178, depending on the voltage level at control logic input port 168. FETs 144 and 128 form a conventional inverter which has its output 176 connected to the emitter terminal of transistor 140. Terminal 168 is preferably connected to a conventional shift register circuit or other logic circuit (not shown) which produces a logic high (five volts) when a control bit in the shift register is set such as that used in a phase lock loop circuit in a conventional radio synthesizer. When a logic high (five volts) is introduced into terminal 168, transistor 146 is turned on, which produces a low $\approx$ zero volts) at output 176, which in turn, pulls control terminal 178 low, and thus causes FET 124 to conduct bringing the voltage at pin 162 to the top rail voltage of Vsource +2VBE. When a logic low (e.g. zero volts) is introduced at input pin 168 of control logic circuit 158, a logic high (e.g. five volts) is introduced at output 176 which turns transistor 140 off. This causes a logic high to develop an input 180 of the inverter formed by FETs 124 and 126, causing FET 126 to turn on and places the lower voltage rail 170 voltage (V source −2VBE) at output terminal 162. The switching between the top and lower voltage rails causes the N channel FET which is connected between input port 160 and output terminal 162 to switch on and off depending on the control logic present at the input port 168 of control logic circuit 158.

Control logic circuit 156 is in turn, designed to be used when a P-channel FET device is connected to pins 162 and 160. When a logic high (five volts) is placed on input 168, the inverter stage formed by FETs 152 and 154 causes FET 154 to turn on and place a logic low at the inverter output 182. A logic low at output 182 turns off transistor 146 which causes a logic high at input 180 to the inverter formed by FETs 124 and 126, which in turn causes FET 126 to turn on, causing the lower voltage rail voltage 170 to be presented at output 162. When a logic low ($\approx$ zero volts) is placed at input port 168 of circuit 156, top voltage rail voltage 172 is caused to be presented at output terminal 162.

Figure 2:
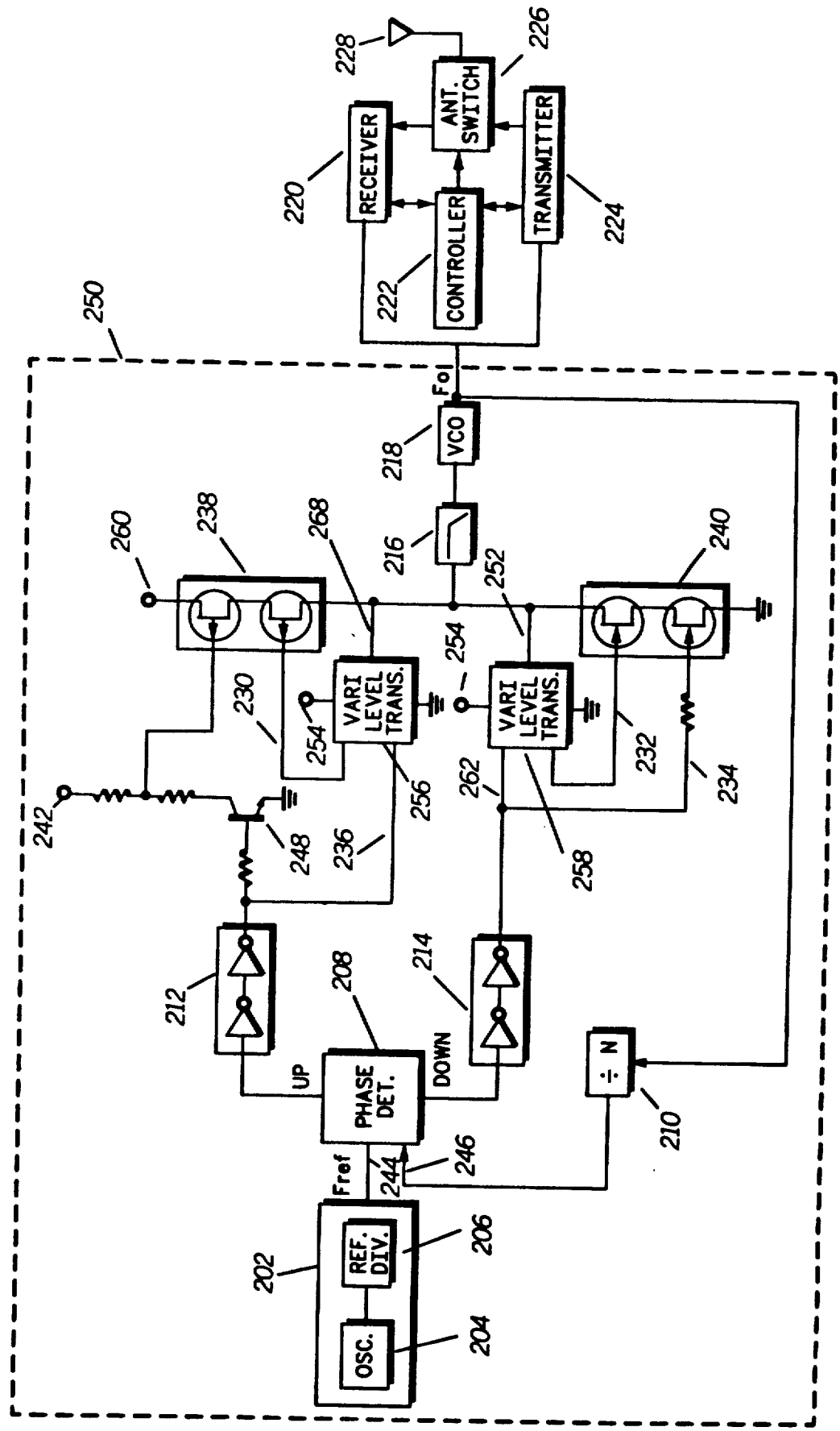
FIG. 2 shows a communication device utilizing a voltage level shifting circuit in accordance with the present invention.

In FIG. 2, a communication device such as a radio 200 utilizing the present invention is shown. The radio comprises a receiver 220 and transmitter 224 selectively coupled to antenna 228 via antenna switch 226. Radio controller 222 can be a conventional microprocessor or microcontroller with appropriate memory and I/O capabilities, as known in the art. Controller 222 controls the operation of both receiver 220 and transmitter 224, and also selectively activates antenna switch 226. Also included as part of radio 200 is phase lock loop (PLL) synthesizer section 250. PLL 250 includes reference oscillator 202 which consists of reference oscillator 204 and reference divider 206. Reference oscillator 202 produces a reference signal having frequency $F_{ref}$. The signal of frequency $F_{ref}$ is applied to the first input of phase detector 208, via line 244. The phase detector 208 has a second input coming from the divide-by-N or loop divisor circuit 210 on line 246, which is the output signal Fo of voltage controlled oscillator (VCO) 218. In order to generate one of a number of desired synthesized frequencies, the synthesized frequency Fo is scaled by a divisor N from circuit 210. The divisor N is chosen to correspond to the desired synthesized frequency.

Phase detector 208 generates signals indicative of the phase relationship between the reference frequency $F_{ref}$ and the scaled, synthesized frequency coming from the divide by N circuit 210. Phase detector 208 produces a pulse, whose duration is proportional to the phase difference when the synthesized frequency Fo must be brought up from its current frequency (UP output from phase detector 208), while a pulse of similar duration is produced when the synthesized frequency Fo must be brought down from its current value (DOWN output from phase detector 208). A steady state signal is produced when the synthesized frequency Fo is at its desired value and no phase difference exists. Both signals either UP or DOWN are sent to conventional driver circuits 212 and 214. The balance of synthesizer 250 consists of a loop filter 216, VCO 218, and charge pump circuitry. The charge pump circuitry section consists of FET circuits 238, and 240 each utilizing a corresponding variable level translator circuit 256, and 258 as discussed in FIG. 1 in order to operate the low voltage FETs (having a breakdown of under 13.8 volts) which form circuit 238 and 240 in the higher operating voltage synthesizer circuit 250 (preferably operating from a typical voltage of 13.8 volts). Since FET circuit 238 is composed of P-channel FETs variable level translator circuit 256 utilizes a control logic circuit 156 (as shown in FIG. 1), while variable level translation circuit 258 utilizes control logic circuit 158 (as shown in FIG. 1) since it is driving an N-channel FET circuit 240. By utilizing the voltage level translators the low breakdown voltage FETs which comprise circuits 238 and 240 can operate as part of PLL 250 has a typical operating voltage of 13.8 volts. Variable level translator circuit 256 being coupled to FET circuit 238 via line 230 which is coupled to the gate terminal of the lower FET of circuit 238, and line 268 which is coupled to the source terminal of the lower FET. Circuit 256 controlling the "on" and "off" operation of circuit 238 which is also coupled to filter 216. Circuit 258 is similarly coupled to FET circuit 240 via line 232 coupled to the gate terminal of the upper FET and line 252 coupled to the source terminal of the upper FET. Line 236 being coupled to the input port of the control means of variable level translator circuit 256, while line 262 is coupled to the input port of the control means of variable level translator circuit 258. A logic high or low on lines 236 and 262 will determine if the respective variable level translator circuits 256 and 258 switch "on" or "off" their respective FET circuits 238 and 240.

The charge pump section of PLL 250 generates a charging or discharging current and supplies it to the capacitive elements found inside of loop filter 216 in response to the up and down pulses received from phase detector 208. This current control signal charges or discharges the capacitive elements in loop filter 216, thereby generating a control voltage for VCO 218. The charge pump is simply a current source or current sink switched by phase detector 208. The current source being supplied by FET circuit 238, and the current sink by FET circuit 240. A current source increases the steering voltage into VCO 218, while a current sink decreases the voltage into VCO 218. Since VCO 218 is voltage-sensitive varying the voltage input to its input port varies output frequency Fo in a predictable manner.

The present invention, as embodied in circuits 256 and 254, provides for a voltage level translation thereby allowing the use of low-voltage FETs (as those found in circuits 238 and 240) to be used in a high voltage circuit such as that found in syntehesizer 250. For example, the FETs in circuits 238 and 240 could be 7.0 volt parts and could be operated in a circuit such as synthesizer 250 operating at a voltage of 13.8 volts.

As has been seen, the circuit of FIG. 1 improves IC reliability for small geometry technologies when used in high voltage circuits. By providing an output voltage which tracks the input voltage, the low voltage device connected to the present invention, in this specific case a FET, can operate in a high voltage circuit without having to worry about breakdown due to high voltage which would destroy the component. The circuit acts as a combination voltage sensor, voltage reference, and gate driver when interfacing to a circuit which has a variable voltage level. Although the preferred embodiment has shown the circuit of FIG. 1 employed for the operation of low voltage FETs, almost any type of active bias circuit or component could be connected to the circuit. The ability of the circuit to track the input reference voltage 160, and provide a choice of two voltages ("on" or "off") states can be employed in many active bias situations especially when dealing with active bias CMOS circuits.

What is claimed is:

1. A voltage level shifting circuit, comprising:
an input port for receiving an input reference voltage which can vary within a predetermined voltage range;
voltage translation means for generating first and second voltage levels each of which is related to the input reference voltage, and each of which varies with variations in the input reference voltage, including a voltage drop state that receives the input reference voltage and that has an output providing an output voltage that is lower than the input reference voltage by a predetermined amount, and further including a voltage rail stage having a lower voltage rail with a voltage equal to the second voltage level and which is coupled to the output of the voltage drop stage, and having a top voltage rail which has a voltage equal to the first voltage level and which is predetermined voltage greater than the lower voltage rail;
control means, having an input port and an output port, for operatively selecting either the first or second voltage levels produced by the voltage translation means in response to the voltage level present at the control means input port by producing a control signal at the control means output port; and
an output terminal for presenting the voltage level selected by the control means.

2. The voltage level shifting circuit of claim 1, wherein the voltage rail stage comprises a plurality of series-connected diodes having a constant-current source stage, and a constant-current sink stage coupled to opposite ends of the series-connected diodes.

3. The voltage level shifting circuit as defined in claim 2, wherein the voltage level shifting circuit operates from a voltage level which is greater than the input reference voltage.

4. A voltage level shifting circuit, comprising:
an input port for receiving an input reference voltage varying within a predetermined voltage range;
voltage translation means for generating first and second voltage levels, each of which is related to the input reference voltage and each of which varies with variations in the input reference voltage, the voltage translation means including a voltage drop stage that receives the input reference voltage and has an output for providing an output voltage that is lower than the input reference voltage by a predetermined amount, and further including a voltage rail stage formed by a plurality of series connected diodes having a lower voltage rail coupled to the output of the voltage drop stage having a voltage equal to the second voltage level, and having a top voltage rail which has a voltage equal to the first voltage level and which is a predetermined voltage greater than the lower voltage rail, the voltage translation means further including a constant current source stage coupled to the top voltage rail and a constant current sink stage coupled to the lower voltage rail which maintain a substantially constant voltage drop across each of the plurality of diodes which form the voltage rail stage and maintains an approximately constant delta voltage difference between the top and lower voltage rails irrespective of the change in the input reference voltage;
control means having an input port and an output port, the control means operatively selecting either the first or second voltage levels produced by the translation means in response to the voltage level present at the control means input port by producing an appropriate control signal at the control means output port; and
an output terminal for presenting the voltage level selected by the control means.

5. A voltage level shifting circuit, comprising: an input port for receiving an input reference voltage varying within a predetermined voltage range;
voltage translation means for generating first and second voltage levels, each of which is related to the input reference voltage and each of which varies with variations in the input reference voltage, the voltage translation means including a voltage drop stage that receives the input reference voltage and has an output for providing an output voltage that is lower than the input reference voltage by a predetermined amount, and further including a voltage rail stage formed by a plurality of series connected diodes having a lower voltage rail coupled to the output of the voltage drop stage having a voltage equal to the second voltage level, and having a top voltage rail which has a voltage equal to the first voltage level and which is a predetermined voltage greater than the lower voltage rail, the voltage translation means further including a constant current source stage coupled to the top voltage rail and a constant current sink stage coupled to the lower voltage rail which maintain a substantially constant voltage drop across each of the plurality of diodes which form the voltage rail stage and maintains an approximately constant delta voltage difference between the top and lower voltage rails irrespective of the change in the input reference voltage;

control means hving an input port and an output port, the control means operatively selecting either the first or second voltage levels produced by the translation means in response to the voltage level present at the control means input port by producing an appropriate control signal at the control means output port: and an output terminal for presenting the voltage level selected by the control means, the voltage translation means further comprises a control state which includes an input port coupled to the output port of the control means and an output port coupled to the output terminal, the control state includes an inverter state comprising first and second FETs having their respective drain terminals coupled to the output terminal, and having their respective gate terminals coupled to the input port of the control stage, the control state also including a first FET having its gate and drain coupled together and coupled to the input port of the control stage and the first FET's source terminal coupled to the top voltage rail, and a second FET having its source terminal coupled to the top voltage rail, the drain terminal of the second FET coupled to the input port of the control stage, and the gate terminal of the second FET coupled to the one of the plurality of diodes which are part of the voltage rail stage.

6. A voltage level shifting circuit as defined in claim 5, wherein the control means is designed to drive an N-channel FET which has its gate terminal coupled to the output terminal and its source terminal coupled to the input means.

7. A voltage level shifting circuit as defined in claim 5, wherein the control means is designed to drive a P-channel FET which has its gate terminal coupled to the output terminal and its source terminal coupled to the input means.

8. A voltage level shifting circuit as defined in claim 5, wherein the constant current source stage is comprised of first and second transistors having their base terminals connected together and coupled to a first operating voltage potential, the emitter terminals of the first and second transistors connected to a second operating voltage potential, the first transistor having its collector terminal connected to the top voltage rail and the collector terminal of the second transistor coupled to the first operating voltage potential.

9. A voltage level shifting circuit as defined in claim 8, wherein the constant current sink state is comprised of a third and a fourth transistors having their respective emitter terminals at zero voltage potential and having their base terminals connected together and coupled to the first operating voltage potential, the fourth transistor having its collector terminal connected to the lower voltage rail and the third transistor having its collector terminal connected to its base terminal.

10. A communication device, comprising:
a receiver; and
a voltage level shifting circuit, having
an input port for receiving an input reference voltage which can vary within a predetermined voltage range;
voltage translation means for generating first and second voltage levels each of which is related to the input reference voltage, and each of which varies with variations in the input reference voltages, including a voltage drop stage that receives the input reference voltage and that has an output providing an output voltage that is lower than the input reference voltage by a predetermined amount, and further including a voltage rail stage having a lower voltage rail with a voltage equal to the second voltage level and which is coupled to the output of the voltage drop stage, and having a top voltage rail which has a voltage equal to the first voltage level and which is a predetermined voltage greater than the lower voltage rail;
a control means, having an input port and an output port, for operatively selecting either the first or second voltage levels produced by the voltage translation means in response to the voltage level present at the control means input port by producing a control signal at the control means output port; and
an output terminal for presenting the voltage level selected by the control means.

11. The communications device of claim 10, wherein the voltage rail stage comprises a plurality of series-connectd diodes having a constant current source stage, and a constant-current sink stage coupled to opposite ends of the series-connected diodes.

* * * * *